(12) United States Patent
Kim et al.

(10) Patent No.: US 9,034,470 B2
(45) Date of Patent: May 19, 2015

(54) RESIN COMPOSITION, MULTI-LAYERED FILM AND PHOTOVOLTAIC MODULE INCLUDING THE SAME

(71) Applicant: LG CHEM, LTD., Seoul (KR)

(72) Inventors: Hyun Cheol Kim, Daejeon (KR); Hyun Seong Ko, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/052,286

(22) Filed: Oct. 11, 2013

(65) Prior Publication Data

US 2014/0034109 A1    Feb. 6, 2014

Related U.S. Application Data

(63) Continuation of application No. PCT/KR2011/009282, filed on Dec. 1, 2011.

(30) Foreign Application Priority Data

Apr. 13, 2011  (KR) .......................... 10-2011-0034335
Dec. 1, 2011  (KR) .......................... 10-2011-0127854

(51) Int. Cl.
*H01L 31/042* (2014.01)
*H01L 31/049* (2014.01)
*B32B 27/30* (2006.01)

(52) U.S. Cl.
CPC ............. *H01L 31/0422* (2013.01); *Y02E 10/50* (2013.01); *H01L 31/049* (2014.12); *B32B 27/304* (2013.01)

(58) Field of Classification Search
CPC ............................ H01L 31/0422; C08L 27/16
See application file for complete search history.

(56) References Cited

U.S. PATENT DOCUMENTS

| | | |
|---|---|---|
| 5,185,403 A | 2/1993 | Lewarchik et al. |
| 6,255,398 B1 | 7/2001 | Zupancic et al. |

(Continued)

FOREIGN PATENT DOCUMENTS

| | | |
|---|---|---|
| CN | 101400711 A | 4/2009 |
| CN | 101678644 A | 3/2010 |

(Continued)

OTHER PUBLICATIONS

Liu et al., "Progress in the production and modification of PVDF membranes," J. Membr. Sci. 375 (2011), 1-27.*

(Continued)

*Primary Examiner* — Ling Choi
*Assistant Examiner* — Catherine S Branch
(74) *Attorney, Agent, or Firm* — McKenna Long & Aldridge, LLP (57) ABSTRACT

A resin composition, a multi-layered film, a backsheet for photovoltaic modules, a method thereof, and a photovoltaic module are provided. The multi-layered film including a coating layer including a fluorine-based polymer has an excellent durability and weather resistance, and also exhibits high interfacial adhesive strength to a substrate since the multi-layered film is formed by coating a cured product of the resin composition including the fluorine-based polymer, an acrylic polymer including a thermosetting functional group, and a heat-curing agent on the substrate. In addition, drying can be performed at a low temperature during the manufacture of the multi-layered film so that the manufacturing costs can be decreased, productivity can be increased, and the deterioration of the product due to heat modification, heat shock, and the like, can be prevented. The multi-layered film can be effectively used as a backsheet for various photovoltaic modules.

18 Claims, 1 Drawing Sheet

(56) References Cited

U.S. PATENT DOCUMENTS

| | | | |
|---|---|---|---|
| 7,176,250 B2 * | 2/2007 | Asakawa et al. | 523/340 |
| 2007/0185296 A1 | 8/2007 | Lindow et al. | |
| 2012/0031475 A1 * | 2/2012 | Kim et al. | 136/252 |

FOREIGN PATENT DOCUMENTS

| | | |
|---|---|---|
| EP | 1069141 A1 | 1/2001 |
| JP | 2009246360 A | 10/2009 |
| JP | 2010-521551 | 6/2010 |
| KR | 1020100015554 | 2/2010 |
| WO | 2008/112026 | 9/2008 |
| WO | 2008157159 A1 | 12/2008 |
| WO | WO 2010107282 A2 * | 9/2010 |
| WO | 2010144520 A1 | 12/2010 |
| WO | 2011084438 A1 | 7/2011 |

OTHER PUBLICATIONS

"How Plastics Are Made," International Association of Plastics Distributors (2004).*

Harper et al., Plastics Materials and Processes: A Concise Encyclopedia, John Wiley & Sons, 2003, p. 241.*

* cited by examiner

RESIN COMPOSITION, MULTI-LAYERED FILM AND PHOTOVOLTAIC MODULE INCLUDING THE SAME

CROSS-REFERENCE TO RELATED APPLICATION

This application is a bypass continuation of International Application No. PCT/KR2011/009282, filed Dec. 1, 2011, and claims the benefit of Korean Patent Application Nos. 10-2011-0034335, filed on Apr. 13, 2011, and 10-2011-0127854, filed Dec. 1, 2011, all of which are hereby incorporated by reference in their entirety for all purposes as if fully set forth herein.

BACKGROUND

1. Technical Field

The disclosure relates to a resin composition, a multi-layered film including a cured product of the resin composition, a backsheet for photovoltaic modules including the same, a method of preparing the same, and a photovoltaic module including the same.

2. Related Art

Recently, there has been increasing interest in new regenerable energy and clean energy because of global environmental problems and exhaustion of fossil fuels. Among these, attention has been paid to solar photovoltaic energy as a representative clean energy source that can solve the environmental problems and the exhaustion of fossil fuels.

A solar cell to which a principle of solar photovoltaic power generation is applied is a device that converts sunlight into electric power, and is prepared in a unit type by performing various types of packaging processes for protecting the cell because it should be exposed to external environment for a long period to facilitate absorption of the sunlight, and the unit is called a photovoltaic module.

Generally, the photovoltaic modules use a backsheet with excellent weather resistance and durability to stably protect a solar cell in the state in which it is exposed to an external environment for a long period. The backsheet generally includes the backsheet laminating a resin layer including a fluorine-based polymer such as polyvinyl fluoride (PVF) on a substrate.

However, the PVF resin has a poor adhesive strength to a polyethylene terephthalate (PET) film that is typically used as a substrate of the backsheet so that a fluorine-based polymer film obtained from extruding or casting is laminated onto a substrate using a urethane-based adhesive and the like. However, the PVF resin has disadvantages in that it requires an expensive facility to manufacture a film; uses an adhesive; and further requires adhesive coating and laminating processes. In addition, the PVF resin has disadvantages in that a thicker film than the thickness of a film required for handling the film should be used in a film manufacturing process; it is limited to the use of various additives, fillers and the like; and requires high process-temperature.

In contrast, when a fluorine-based polymer film is prepared by coating and drying a resin suspension or solution on a substrate, a solvent having a high boiling point is generally used and a high drying temperature of at least 200° C. is required.

The PVF resin solution that requires a high drying temperature uses a great amount of energy to provide the high drying temperature, thereby increasing the manufacturing cost of the backsheet of photovoltaic modules and applying thermal shock to the substrate or causing thermal deformation to the substrate. Consequently, the quality (mechanical characteristics, etc.) of the product is degraded, and its mechanical properties rapidly deteriorate over a long-term outdoor use.

Accordingly, a backsheet material for a solar cell continues to be on demand because the backsheet material has excellent durability and weather resistance and also can be dried at low drying temperature, wherein the backsheet material can serve to improve the productivity and quality of the photovoltaic modules and can decrease the manufacturing cost of the photovoltaic backsheet.

SUMMARY

The embodiments of the disclosure are directed to provide a resin composition having excellent durability and weather resistance.

Also, the embodiments of the disclosure are directed to provide a multi-layered film including a cured product of the resin composition and a method of manufacturing the same.

Furthermore, the embodiments of the disclosure are directed to provide a backsheet for photovoltaic modules including the multi-layered film and a photovoltaic module.

One aspect of the embodiments provides a resin composition including a fluorine-based polymer; an acrylic polymer including at least one thermosetting functional group selected from the group consisting of a carboxyl group, an amide group, an amino group, an epoxy group, an isocyanate group, a cyano group, an acid anhydride group, a mercapto group, a silanol group, an alkoxysilane group, and an oxazoline group; and a heat-curing agent.

Another aspect of the embodiments provides a multi-layered film including a substrate; and a coating layer formed on the substrate and including a cured product of a resin composition.

Still another aspect of the embodiments provides a method of manufacturing a multi-layered film including applying the resin composition onto the substrate and curing the applied resin composition to form a coating layer.

Yet another aspect of the embodiments provides a backsheet for photovoltaic modules including the multi-layered film and a photovoltaic module including the backsheet for photovoltaic modules.

BRIEF DESCRIPTION OF THE DRAWINGS

The above and the other objects, features and advantages of the present invention will become more apparent to those of ordinary skill in the art by describing in detail the illustrative embodiments thereof with reference to the attached drawings, in which.

DETAILED DESCRIPTION

Hereinafter, the illustrative embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, the first element could be termed the second element, and, similarly, the second element could be termed the first element, without departing from the scope of the illustrative embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the illustrative embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, illustrative embodiments of the present invention will be described in detail below. To aid in understanding the present invention, like numbers refer to like elements throughout the description of the figures, and the description of the same elements will not be reiterated.

The resin composition according to one embodiment includes a fluorine-based polymer; an acrylic polymer including at least one thermosetting functional group selected from the group consisting of a carboxyl group, an amide group, an amino group, an epoxy group, an isocyanate group, a cyano group, an acid anhydride group, a mercapto group, a silanol group, an alkoxysilane group, and an oxazoline group; and a heat-curing agent.

A specific type of the fluorine-based polymer that is included in the resin composition may be, for example, a homopolymer, a copolymer or a combination thereof, that includes at least one of monomer selected from the group consisting vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluoro(butylethylene), perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD), and perfluoro-2-methylene-4-methyl-1,3-dioxolane (PMD) in a polymerized type, but the present invention is not limited thereto. According to one illustrative embodiment, a copolymer including VDF in a polymerized type may be used.

Also, the fluorine-based polymer may be a copolymer including VDF and a comonomer or a copolymer including VF and a comonomer. A type of the comonomer that may be included in the fluorine-based copolymer in a copolymerized type is not particularly limited, but may, for example, include at least one selected from the group consisting of TFE, HFP, CTFE, trifluoroethylene, hexafluoroisobutylene, perfluoro(butylethylene), PMVE, PEVE, PPVE, PHVE, PDD, and PMD. As an example, at least one of HFP, CTFE and the like may be used, but the present invention is not limited thereto.

In addition, the content of the comonomer that is included in the fluorine-based polymer may be, for example, about 0.5 wt % to 50 wt %, 1 wt % to 40 wt %, 7 wt % to 40 wt %, 10 wt % to 30 wt %, or 10 wt % to 20 wt % based of the total weight of the fluorine-based copolymer. The coating layer formed with the resin composition within this content range of the comonomer may secure weather resistance, durability, and the like, and also may induce effective interdiffusion and drying low temperature.

According to the illustrative embodiments of the present invention, the fluorine-based polymer may have a weight average molecular weight of 50,000 to 1,000,000. The weight average molecular weight is a value converted from the polystyrene standard that is measured using gel permeation chromatography (GPC). Excellent solubility and other physical properties may be secured by controlling the weight average molecular weight of the resin as mentioned above according to the present invention.

According to the illustrative embodiments of the present invention, the fluorine-based polymer may have a melting point of 80° C. to 175° C. or 102° C. to 165° C. The melting point of the resin may be controlled to 80° C. or higher so that modification of the multi-layered film formed with the resin composition may be prevented upon use of the multi-layered film. Also, the melting point may be controlled to 175° C. or lower so that solubility in a solvent may be controlled and gloss of the coating surface may be improved.

According to the illustrative embodiments of the present invention, the fluorine-based polymer included in the resin composition has an amorphous area and the fluorine-based polymer with a degree of crystallinity of 55% or less may be used. The fluorine-based polymer with the degree of crystallinity as mentioned above may effectively form a blended material with the acrylic polymer in the resin composition. When the above-mentioned resin composition is used later to coat a film, improvement of the adhesive strength may be maximized because interdiffusion with the bottom layer of the coating layer of the resin composition may be effectively progressed. In addition, a solvent with a low boiling point may be used by using the fluorine-based polymer as mentioned above. Therefore, the drying process of the coating layer of the resin composition may be performed at a low temperature, thereby securing an excellent quality and improving productivity of an applied product.

In the present invention, the fluorine-based polymer with the amorphous area may have a degree of crystallinity of 55% or less, for example, 50% or less, or 10% to 50%. The term "degree of crystallinity" used in the present invention refers to a percentage (based on weight) of the crystalline area that is included in the whole resin, may be measured using a known method, such as differential scanning calorimetry, and the like, and particularly may be measured using the method described in the following Examples of the present invention.

The degree of crystallinity of the fluorine-based polymer as mentioned above may be obtained by copolymerizing the comonomer as mentioned above to relieve a regular element array of the fluorine-based polymer or polymerizing the polymer as a branched polymer type when preparing the fluorine-based polymer.

The fluorine-based polymer as mentioned above is thermoplastic, and the resin composition of the present invention further includes a thermosetting acrylic polymer and a heat-curing agent in addition to the thermoplastic fluorine-based polymer. The resin composition using the thermoplastic fluorine-based polymer may exhibit an excellent film-coating property and an excellent adhesion effect, compared to the resin composition using the thermosetting fluorine-based polymer. For example, the blend of the thermoplastic fluorine-based polymer and the thermosetting acrylic polymer forms an interpenetrating network of the thermoplastic polymer and thermosetting polymer so that brittleness, which is a disadvantage of the thermosetting resin, may be improved and strong interfacial bond strength may be secured even when there is heat shock or mechanical shock.

The thermosetting acrylic polymer included in the resin composition includes at least one thermosetting functional group selected from the group consisting of a carboxyl group, an amide group, an amino group, an epoxy group, an isocyanate group, a cyano group, an acid anhydride group, a mercapto group, a silanol group, an alkoxysilane group, and an oxazoline group. The resin composition is endowed with a thermosetting property, thereby improving the adhesive strength to the substrate of the resin composition.

That is, the acrylic polymer that is highly compatible with the fluorine-based polymer is selected in the resin composition of the present invention, so that it can form a blend with the fluorine-based polymer in the resin composition, thereby giving the thermosetting functional group to the acrylic polymer.

A type of the thermosetting functional group included in the thermosetting acrylic polymer of the present invention may be, for example, at least one selected from the group consisting of a carboxyl group, an amide group, an amino group, an epoxy group, an isocyanate group, a cyano group, an acid anhydride group, a mercapto group, a silanol group, an alkoxysilane group, and an oxazoline group, which may cause a curing reaction by a heat-curing agent.

In one illustrative embodiment, the thermosetting functional group may be at least one selected from the group consisting of a carboxyl group, an epoxy group, and an oxazoline group, but the present invention is not limited thereto.

In the illustrative embodiments of the present invention, a type of material that is able to introduce or provide the thermosetting functional group into the acrylic polymer is not particularly limited, but compounds widely known in the art may be used as long as they may introduce the thermosetting functional group. For example, the acrylic polymer including the thermosetting functional group may be provided by copolymerizing at least one acrylic-based compound selected from the group consisting of (meth)acrylate, alkyl(meth) acrylate, and isobornyl(meth)acrylate and at least one monomer including the thermosetting functional group. In addition, a copolymer further including an aromatic vinyl monomer such as styrene may be prepared.

The acrylic polymer may be a (meth)acrylic polymer that includes one or two or more alkyl(meth)acrylates having 1 to 14 carbons as the main component in order to give an excellent adhesion property and balance of compatibility with the fluorine-based polymer. The (meth)acrylate polymer that includes one or two or more alkyl(meth)acrylates as the main component may be a (meth)acrylic polymer including 50 wt % to 99.9 wt % of one or two or more alkyl(meth)acrylates as a monomer component.

In the illustrative embodiments of the present invention, a specific example of the alkyl(meth)acrylate may, for example, include methyl(meth)acrylate, ethyl(meth)acrylate, propyl(meth)acrylate, n-butyl(meth)acrylate, s-butyl(meth) acrylate, t-butyl(meth)acrylate, isobutyl(meth)acrylate, hexyl(meth)acrylate, 2-ethylhexyl(meth)acrylate, n-octyl (meth)acrylate, isooctyl(meth)acrylate, n-nonyl(meth)acrylate, isononyl(meth)acrylate, n-decyl(meth)acrylate, isodecyl(meth)acrylate, n-dodecyl(meth)acrylate, n-tridecyl (meth)acrylate, n-tetradecyl(meth)acrylate, and the like.

As the polymerizable monomer used to give the thermosetting functional group, for example, a component having the thermosetting functional group, such as a carboxyl group-containing monomer, an amide group-containing monomer, an amino group-containing monomer, an epoxy group-containing monomer, an isocyanate group-containing monomer, a cyano group-containing monomer, an acid anhydride group-containing monomer, a mercapto group-containing monomer, a silanol group-containing monomer, an alkoxysilane group-containing monomer, an oxazoline group-containing monomer, and the like, may be properly used, and these monomer compounds may be used alone or in combination.

The carboxyl group-containing monomer may, for example, include acrylic acid, methacrylic acid, carboxyethyl (meth)acrylate, carboxypentyl(meth)acrylate, itaconic acid, maleic acid, fumaric acid, crotinic acid, and the like. Especially, acrylic acid and methacrylic acid may be used among these.

The amide group-containing monomer may, for example, include (meth)acrylate, diethylacrylamide, N-vinylpyrrolidone, N,N-dimethyl(meth)acrylamide, N,N-diethyl(meth) acrylamide, N,N'-methylenebisacrylamide, N,N-dimethylaminopropylacrylamide, N,N-dimethylaminopropylmethacrylamide, diacetone(meth) acrylamide, and the like.

The amino group-containing monomer may be, for example, aminoethyl(meth)acrylate, N,N-dimethylaminoethyl(meth)acrylate, N,N-dimethylaminopropyl(meth)acrylate, and the like.

The epoxy group-containing monomer may, for example, include glycidyl alkyl(meth)acrylate, such as glycidyl(meth) acrylate, methylglycidyl(meth)acrylate, allyl glycidylether, and the like.

The isocyanate group-containing monomer may be (meth) acryloylisocyanate, phenol of (meth)acryloylisocyanate ethyl, a methylethylketooxime addition product, or the like.

The cyano group-containing monomer may be, for example, acrylonitrile, or methacrylonitrile.

The acid anhydride group-containing monomer may, for example, include maleic anhydride, itaconic anhydride, an anhydride of the carboxyl group-containing monomer, and the like.

The silanol group-containing monomer may, for example, include (meth)acryloxy propyltrihydroxy silane, vinyl trihydroxy silane, allyl trihydroxy silane, and the like.

The mercapto group-containing monomer may, for example, include mercapto ethyl(meth)acrylate, mercapto propyl(meth)acrylate, mercapto butyl(meth)acrylate, and the like.

The alkoxysilane group-containing monomer may, for example, include (meth)acryloxy propyltrialkoxy silane, vinyl tri alkoxy silane, allyl tri alkoxy silane, and the like.

The oxazoline group-containing monomer may, for example, include 2-vinyl-2-oxazoline, 2-vinyl-4-methyl-2-oxazoline, 2-vinyl-5-methyl-2-oxazoline, 2-isoprophenyl-2-oxazoline, 2-isoprophenyl-4-methyl-2-oxazoline, 2-isoprophenyl-5-ethyl-2-oxazoline, and the like.

The polymerizable monomer that may give the thermosetting functional group as mentioned above can be properly selected and then used, and an example of the polymerizable monomer may include glycidyl(meth)acrylate, glycidyl alkyl (meth)acrylate, (meth)acrylic acid, (meth)acrylonitrile, isocyanato alkyl(meth)acrylate, maleic anhydride, methacryloxy propyl triethoxy(methoxy)silane, vinyl trimethoxy silane, allyl trimethoxy silane, 2-isoprophenyl-2-oxazoline, and the like.

In the present invention, the monomers containing the above-mentioned thermosetting functional groups may be used alone or in combination.

The acrylic polymer including the thermosetting functional group may be prepared by further using for example, an aromatic vinyl compound such as styrene, chlorostyrene, chloromethylstyrene, methylstyrene, or other substituted styrene, or methacrylonitrile, acrylonitrile, cyclohexylmaleimide, hydroxyethyl(meth)acrylate, and the like in order to control a glass transition temperature or molecular weight distribution of the copolymer or increase the solubility of the copolymer.

For the content of the thermosetting functional group in the acrylic polymer including the thermosetting functional group that may be used in the illustrative embodiments of the present invention, a molecular weight corresponding to one thermosetting functional group, that is, an equivalent weight of the thermosetting functional group may be 800 or more to 40,000 or less and for some illustrative embodiments, it may be within 2,000 to 20,000. When the equivalent weight of the thermosetting functional group exceeds 40,000, there is no great contribution to the improvement of adhesive strength, and when it is less than 800, the mechanical property, compatibility, and weather resistance of the applied product of the resin composition may be degraded.

The term "equivalent weight of the thermosetting functional group" refers to a number obtained by dividing the total molecular weight of the resin by the number of the corresponding thermosetting functional group, that is, refers to the molecular weight of the resin including one thermosetting functional group, and may be measured by the general chemical titration method known in the art.

A weight average molecular weight of the acrylic polymer including the thermosetting functional group that is used in the present invention may be 100,000 to 5,000,000. When the weight average molecular weight is less than 100,000, the fluorine-based polymer may not be endowed with a proper adhesive strength due to low cohesiveness, and when it exceeds 5,000,000, it tends to decrease the fluidity of the polymer and cause delamination.

A method of polymerizing the acrylic polymer including the thermosetting functional group that is used in the present invention may be performed by a known method, such as solution polymerization, emulsion polymerization, bulk polymerization, or suspension polymerization, but the present invention is not particularly limited thereto. In addition, the resulting polymer may be any one of a random copolymer, a block copolymer, an alternating copolymer, a graft copolymer, and the like. Various methods that are able to introduce the desired functional group in a polymer are known in the art, and the present invention may use any of the various methods.

According to the illustrative embodiments of the present invention, the content of the acrylic polymer including the thermosetting functional group that is included in the resin composition may be less than 50 wt %, or 2 wt % to 30 wt % based on the total weight of the resin composition. When the content of the acrylic polymer including the thermosetting functional group exceeds 50 wt %, a mechanical property and weather resistance of the coating layer that is formed with the resin composition may be degraded.

The resin composition according to the illustrative embodiments of the present invention includes a heat-curing agent. Heat-curing agents are not specifically limited as long as they may cure the thermosetting functional group of the thermosetting acrylic polymer by heating.

An example of the heat-curing agent may include at least one amine-based curing agent, an acid anhydride-based curing agent, an imidazole-based curing agent, a carboxylic acid-based curing agent, an organic acid hydrazide-based curing agent, a phenol-based curing agent, a polyol-based curing agent, an oxazoline-based curing agent, a melamine-based curing agent, and the like, but the present invention is not limited thereto.

An example of the amine-based curing agent may include triethylenetetramine ($NH_2CH_2CH_2(NHCH_2CH_2)_2NH_2$), diethyl amino propyl amine, metaphenylenediamine, polyamide amine, dicyandiamide, $BF_3$-monoethylene amine, and the like, which induces reaction of an epoxy group, and the like.

The acid anhydride-based curing agent may include hexahydro phthalic anhydride, dodecenyl succinic anhydride, chlorendic anhydride, phthalic anhydride, maleic anhydride, and the like, which induces reaction of an epoxy group, and the like.

The imidazole-based curing agent may include 2-ethyl-4-methylimidazole, 1-cyanoethyl-2-ethyl-4-methylimidazole, 2-phenyl-4-methyl-5-hydroxymethylimidazole, 1-cyanoethyl-2-nylimidazolium-trimellitate, 2,4-diamino-6-[2-methylimidazolyl-(1))]-ethyl-S-triazine, and the like, which induces reaction of an epoxy group, and the like.

A compound with 2 to 22 carbons including at least two carboxyl groups in a molecule may be used as the carboxylic acid-based curing agent.

A specific example include an aliphatic polyvalent carboxylic acid, such as oxalic acid (HOOCCOOH), malonic acid ($HOOCCH_2COOH$), succinic acid ($HOOC(CH_2)_2COOH$), glutaric acid ($HOOC(CH_2)_3COOH$), adipic acid ($HOOC(CH_2)_4COOH$), pimelic acid ($HOOC(CH_2)_5COOH$), suberic acid ($HOOC(CH_2)_6COOH$), azelaic acid ($HOOC(CH_2)_7COOH$), sebacic acid ($HOOC(CH_2)_8COOH$), 1,11-undecanedioic acid ($HOOC(CH_2)_9COOH$), 1,12-dodecanedioic acid ($HOOC(CH_2)_{10}COOH$), 1,13-brassylic acid ($HOOC(CH_2)_{11}COOH$), 1,14-tetradecanedioic acid ($HOOC(CH_2)_{12}COOH$), 1,15-pentadecanedioic acid ($HOOC(CH_2)_{13}COOH$), 1,16-hexadecanedioic acid ($HOOC(CH_2)_{14}COOH$), 1,18-octadecanedioic acid ($HOOC(CH_2)_{16}COOH$), carbomethylenedioic acid, dodecenylsuccinic acid, ethyloctadecanedioic acid, or the like; an aromatic polyvalent carboxylic acid, such as phthalic acid, isophthalic acid, terephthalic acid, trimellitic acid, pyromellitic acid, 4,4'-benzophenone tetracarboxylic acid, 3,3',4,4'-oxydiphthalic acid, 3,3',4,4'-biphenyltetracarboxylic acid, phenyloctadecanediol acid, or the like; an alicyclic polyvalent carboxylic acid, such as hexahydrophthalic acid, methyltetrahydrophthalic acid, methylhexahydrophthalic acid, 5-norbornane-2,3-dicarboxylic acid, 5-norbornene-2,3-dicarboxylic acid, methylnorbornane-2,3-dicarboxylic acid, methylnorbornene-2,3-dicarboxylic acid, 1,4,5,6,7,7-hexachloro-5norbornene-2,3-dicarboxylic acid, 5-(2,5-dioxotetrahydro-3-furanyl)-3-methyl-cyclohexene-1,2-dicarboxylic acid, 5-(2,5,-dioxotetrahydro-3-furanyl)norbornane-2,3-dicarboxylic acid, or the like.

The organic acid hydrazide-based curing agent may include succinic acid dihydrazide, adipic acid dihydrazide, salicyclic acid dihydrazide, and the like, which induces reaction of an epoxy group, and the like.

In addition to the curing agents, a generally known curing agent having a functional group that is able to cure the thermosetting reaction group, for example, water, and the like may be used without limitation.

In the illustrative embodiments, the heat-curing agent may be included in such a content that an equivalent weight ratio of the functional group of the heat-curing agent and the thermosetting functional group of the acrylic polymer may be in the range of 0.1 to 3. In this case, when the equivalent weight ratio of the functional group of the heat-curing agent and the thermosetting functional group of the acrylic polymer is high, the curing agent may be kept unreacted, which leads to a decrease of physical properties. Since some of the functional groups of the heat-curing agent may or may not participate in the curing reaction, the cross-linking degree of the resin composition is not increased. Accordingly, the lower the equivalent weight ratio is, the higher the cross-linking degree because all the functional groups of the heat-curing agent react with the thermosetting functional group of the acrylic polymer. However, when too much cross-linking occurs, the film breaks easily, and thus the cross-linking degree may be maintained in a proper level thereby giving an excellent physical property and adhesive strength to the film.

For example, when the carboxylic acid-based curing agent is used as the heat-curing agent in the illustrative embodiments of the present invention, the equivalent weight ratio of the carboxyl group of the heat-curing agent and the thermosetting functional group of the acrylic polymer may be 0.1 to 3. That is, the carboxyl group of the heat-curing agent may be used at about 0.1 to 3 moles or about 0.2 to 2 moles per 1 mole, based on the total amount of the thermosetting functional group that is included in the resin composition. This is because when the content of the heat-curing agent is too small, the curing degree is decreased and sufficient physical property is not obtained and when the content of the heat-curing agent is excessively high, sufficient cross-linking degree may not be obtained or the physical properties may be degraded due to the presence of an unreacted curing agent.

The resin composition may further include a curing accelerator as necessary. An example of the curing accelerator may include a tertiary amine, a tertiary amine salt, a quaternary ammonium salt, an imidazole compound and a salt thereof, a phosphine compound, a quaternary phosphonium salt, a boron compound, an alcohol, a metal salt, an organic metal complex salt, and the like, but the present invention is not limited thereto.

For the resin composition, the above-mentioned components may be dissolved or distributed in a solvent having a relatively low boiling point, especially, a solvent with a boiling point of 200° C. or lower. For the present invention, the fluorine-based polymer may be effectively dissolved in a solvent with a relatively low boiling point by being mixed with the acrylic polymer including the thermosetting functional group. Accordingly, when using the resin composition of the present invention, a high-temperature drying process is not required during the manufacture of an applied product, thereby reducing the manufacturing costs. Also, heat modification and heat shock of the product that may be induced during the high-temperature drying process may be prevented, thereby improving the quality of the product.

An example of the above-mentioned solvent that may be used in the present invention may include, but is not limited to, acetone, methylethylketone (MEK), dimethylformamide (DMF), dimethylacetamide (DMAC), and the like, which may be used alone or in combination.

The solvent, such as MEK, DMF, or DMAC is evaporated at a temperature of 200° C. or lower, may easily dissolve the resin composition including the heat-curing agent and the acrylic polymer including the thermosetting functional group, and also may be dried at a relatively low temperature after being applied to the substrate later. In addition, the interdiffusion action between the substrate and the acrylic polymer component including the thermosetting functional group and the fluorine-based polymer of the coating layer may occur in the interface (i.e., contact surface) between the substrate and the resin composition including the acrylic polymer including the thermosetting functional group and the fluorine-based polymer that are applied to the substrate by swelling the surface-treated layer of the substrate or the surface of the substrate in the solvent of the resin composition when the resin composition is coated on the substrate, so that the physical and chemical bond strength between the coating layer and the substrate may be improved, thereby further improving the adhesive strength between the substrate and the resin layer. This is because the acrylic polymer including the thermosetting functional group decreases the degree of crystallinity of the fluorine-based polymer and thus increases the amorphous area in which the above-mentioned interdiffusion may occur, thereby improving the interfacial bond strength between the substrate and the coating layer of the resin composition.

In addition to the above-mentioned components, the resin composition may further include a pigment or a filler in order to control the color or opacity, or realize other objects. In this case, an example of the pigment or the filler that may be used herein may be a metal oxide such as titanium dioxide ($TiO_2$), silica or alumina, a black pigment such as calcium carbonate, barium sulfate or carbon black, a pigment component exhibiting other colors, or the like, but the present invention is not limited thereto. The above-mentioned pigment or filler may act to further improve the adhesive strength of the coating layer of the resin composition due to the presence of a certain functional group that is included in each component, as well as the innate effect to control the color and opacity.

The content of the other additive such as the pigment or filler may be 60 wt % or less, based on the total solid content of the resin composition, but the present invention is not limited thereto.

Also, the resin composition may further include at least one of the general components, such as a UV stabilizer, a heat stabilizer, or a barrier particle.

Each of the above-mentioned additives may be dissolved in a solvent along with the fluorine-based polymer, and the like, or may be mixed with the solvent including the fluorine-based polymer, the acrylic polymer including the thermosetting functional group, and the heat-curing agent after being prepared in a mill base type, regardless of the components. A chemical interaction, such as a van der Waals bond, a hydrogen bond, an ion bond or a covalent bond may be generated by the functional group that is included in the additive such as the filler or the dispersing agent, which may be included in the above-mentioned resin composition, so that the adhesive strength between the substrate and the coating layer of the resin composition may be further improved.

In the present invention, a method of preparing the resin composition, a ratio of the respective components included in the resin composition, and the like, are not particularly limited, and various methods known in the art may be properly used.

Figure 1:
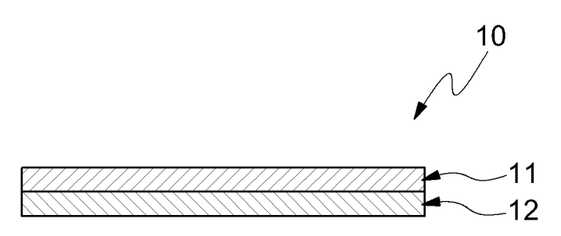
FIG. 1 is an outlined cross-sectional diagram of a multi-layered film according to one embodiment of the present invention.

FIG. 1 is a schematic cross-sectional diagram showing the multi-layered film according to one illustrative embodiment. With reference to FIG. 1, the multi-layered film 10 according to one illustrative embodiment includes a substrate 12, and a coating layer 11 formed on the substrate 12 and including a cured product of the resin composition according to the illustrative embodiments of the present invention.

A specific type of the substrate 12 included in the multi-layered film 10 of the present invention is not particularly limited, but may include various materials known in the art, and may be properly selected and used according to the required function and application.

According to one illustrative embodiment, the substrate may be various metals or polymer sheets. An example of the metal may include aluminum, iron, and the like, and an example of the polymer sheet may include a polyester-based sheet, a polyamide-based sheet, a polyimide-based sheet, and the like. Among these, the polyester-based sheet may be generally used, but the present invention is not limited thereto. An example of the polyester-based sheet may include a single sheet, such as PET, polyethylene naphthalate (PEN) or polybutylene terephthalate (PBT), a laminated sheet, a coextrusion material, and the like, but the present invention is not limited thereto.

In addition, a polyester-based sheet with excellent hydrolysis resistance may be used as the polyester-based sheet. The polyester-based sheet with excellent hydrolysis resistance may be a polyester-based sheet having a low content of oligomer that is generated during a condensation polymerization. In addition, a known heat treatment for improving hydrolysis resistance is further applied to the polyester-based sheet to reduce moisture content of the polyester and decrease the contraction ratio, thereby further improving the hydrolysis resistance. A commercial product such as a sheet with excellent hydrolysis resistance may also be used.

The thickness of the substrate may be in the range of about 50 to 500 µm or 100 to 300 µm, but the present invention is not limited thereto. An electrical insulating property, a moisture barrier property, a mechanical property, a handling property, and the like of the multi-layered film may be excellently maintained by controlling the thickness of the substrate as mentioned above. However, the thickness of the substrate may not be limited to the above-mentioned range in the present invention, and it may be properly controlled, when necessary.

In the illustrative embodiments, a surface treatment, such as a high frequency spark electro-discharge treatment, such as corona treatment or plasma treatment; a heat treatment; a flame treatment; an anchoring agent treatment; a coupling agent treatment; a primer treatment or a chemical activation treatment using gas phase Lewis acids (ex. BF3), sulfuric acid or high-temperature sodium hydroxide may be performed in order to further improve the adhesive strength with the coating layer including the fluorine-based polymer.

In addition, an inorganic oxide, such as silicon oxide or aluminum oxide may be deposited to the substrate for further improvements of the moisture barrier property, and the like. In this situation, the above-described surface treatment, such as the spark electro-discharge treatment, such as the corona or plasma treatment, the flame treatment, the anchoring agent treatment, the coupling agent treatment, the primer treatment or the chemical activation treatment may be performed on the deposition treatment layer.

The multi-layered film 10 of the present invention includes a coating layer 11 formed on the substrate 12 and including the cured product of the resin composition, which includes the fluorine-based polymer, the acrylic polymer including the thermosetting functional group, and the heat-curing agent.

The term "coating layer" used in the present invention refers to a resin layer formed by coating. More specifically, the coating layer refers to a layer of the above-mentioned resin composition formed by coating the coating solution prepared by dissolving the components constituting the resin layer in a solvent, especially, a solvent with a low boiling point, on a substrate, but not by laminating the sheet prepared by the casting method or the extruding method on a substrate using an adhesive.

The coating layer 11 does not include the thermoplastic fluorine-based polymer alone, but further includes the thermosetting acrylic polymer in addition to the thermoplastic fluorine-based polymer. Therefore, the adhesive strength of the fluorine-based polymer to the substrate 12 may be improved as its cured product. That is, when the acrylic polymer with excellent compatibility with the fluorine-based polymer is selected, a blend with the fluorine-based polymer in the coating layer may be easily formed, thereby giving the thermosetting functional group to the acrylic polymer. Also, the thermosetting property may be given by curing the resin composition including the heat-curing agent.

The coating layer 11 may be prepared by applying the resin composition according to the above-described illustrative embodiments to the substrate 12 and curing the resin composition. The description of the resin composition for forming the coating layer 11 is the same as mentioned above.

In the present invention, the thickness of the coating layer 11 may be about 3 µm to 50 µm, or 10 µm to 30 µm. When the thickness of the coating layer including the cured product of the resin composition including the fluorine-based polymer, the acrylic polymer including the thermosetting functional group and the heat-curing agent is less than 3 µm, the coating layer is too thin, and thus the filler may be insufficiently filled thereby degrading the light interruption property, and when it exceeds 50 µm, the manufacturing costs may be increased.

The multi-layered film 10 of the present invention may include the coating layer 11 including the cured product, which is obtained by applying the resin composition including certain components to the substrate 12 and curing the resin composition as mentioned above. Accordingly, since the solvent of the resin composition serves to swell the surface-treated layer of the substrate or the surface of the substrate in the process of coating the resin composition on the substrate, the interdiffusion action between the substrate and the acrylic polymer including the thermosetting functional group and the fluorine-based polymer of the coating layer may occur in the interface (i.e., a contact surface) between the coating layer and the substrate, thereby improving the adhesive strength between the multi-layered film and the substrate.

As the multi-layered film according to one illustrative embodiment of the present invention, the multi-layered film which includes a substrate, a coating layer including the cured product of the resin composition formed on the substrate may be used for a backsheet for a photovoltaic module.

FIG. 1 shows one case of the multi-layered film 10 having a coating layer 11 formed on only one surface of the substrate 12 according to the illustrative embodiments of the present invention. However, the multi-layered film (not shown) according to the other embodiments of the present invention may include coating layers formed on both surfaces of the substrate by forming a coating layer on the other surface of the substrate.

In addition, the multi-layered film according to the illustrative embodiments of the present invention may further include various functional layers known in the art, when necessary. An example of the functional layer may include an adhesive layer, an insulating layer, and the like. For example, the multi-layered film of the present invention may have the above-mentioned coating layer formed on one surface of the substrate, and have the adhesive layer and insulating layer sequentially formed on the other surface. The adhesive layer or insulating layer may be formed using various methods known in the art. For example, the insulating layer may be a layer of ethylenevinylacetate (EVA) or linear low-density polyethylene (LDPE). The EVA or linear LDPE layer may not only serve as the insulating layer but also serve to increase the adhesive strength with the encapsulant, decrease the manufacturing costs and maintain excellent re-workability.

Another aspect of the present invention is directed to providing a method of manufacturing a multi-layered film which includes applying the resin composition including the fluorine-based polymer, the acrylic polymer including the thermosetting functional group and the heat-curing agent to the substrate, and curing the applied resin composition to form a coating layer.

A method of applying the resin composition to the substrate is not particularly limited in the illustrative embodiments of the present invention. For example, the coating solution prepared by dissolving or distributing the above-mentioned composition in a proper organic solvent or aqueous solvent may be applied to the substrate based on various methods that are known in the art. At this point, applying the method may include any methods that are able to form a uniform coating layer, for example, a known printing method such as offset printing or gravure printing, or a known applying method such as roll coating, knife edge coating or gravure coating, but the present invention is not limited thereto. In addition to the above-mentioned methods, various methods known in the art may be used in the present invention, and the resin composition may further include other various additives, when necessary.

A specific type of substrate that may be used in the preparation method of the present invention is as mentioned above, and the substrate may be pre-treated using a proper treatment such as deposition treatment, anchoring agent treatment, coupling agent treatment, primer treatment, heat treatment, plasma treatment or corona treatment, or a substrate pre-treated using the above-mentioned treatments may be used herein.

In the illustrative embodiments of the present invention, the resin composition may be prepared by dissolving or distributing each component in a solvent with a relatively low boiling point, specifically a boiling point of 200° C. or lower as mentioned above. Accordingly, since the method of manufacturing the multi-layered film according to the present invention does not require a high-temperature drying process, the manufacturing costs may be decreased and heat modification or heat shock of the substrate, which may be induced during the high-temperature drying process, may also be prevented, thereby improving the quality of the product.

The above-mentioned solvent that is evaporated at a temperature of 200° C. or lower may easily dissolve the components of the resin composition including the above-mentioned fluorine-based polymer, the acrylic polymer including the thermosetting functional group and the heat-curing agent, and also may be dried at a relatively low temperature after being applied to the substrate.

In the present invention, forming of the coating layer may be performed by applying the resin composition, followed by curing the applied resin composition. Heating and curing conditions are not particularly limited, but heating and curing may be, for example, set within a temperature range of 200° C. or lower. In addition, drying the resin composition applied to the substrate may be further performed before curing and after applying. Drying condition is not particularly limited, but drying may be, for example, performed at a temperature of 200° C. or lower, or about 100° C. to 180° C. for about 30 seconds to 30 minutes or about 1 minute to 10 minutes. Curing and drying as mentioned above may be performed at the same time. An increase in the manufacturing costs may be prevented and deterioration of the product quality due to heat modification, heat shock, and the like, may be prevented by controlling the curing and drying conditions as mentioned above.

Still another aspect of the present invention is directed in providing a backsheet for a solar cell including the multi-layered film.

The backsheet for the solar cell may include the coating layer including the cured product of the mixture of the thermoplastic fluorine-based polymer and the thermosetting acrylic polymer as mentioned above, and the acrylic polymer may include the thermosetting functional group to form a chemical covalent bond between the functional groups of the substrate and the resin layer so that excellent adhesive strength can be provided. Specifically, the fluorine-based polymer and the acrylic polymer including the thermosetting functional group that are included in the coating layer may be interdiffused into the substrate or a surface-treated layer of the substrate so that chemical covalent bonds may be formed between the coating layer and the substrate, and also the adhesive strength may be improved by a chain entanglement and a van der Waals force between the molecular chains.

Still another aspect of the present invention is directed in providing a photovoltaic module including the backsheet for solar cells.

The structure of the photovoltaic modules of the present invention is not particularly limited as long as the multi-layered film is included as the backsheet for solar cells, and various structures widely known in the art may be used without limitation.

Generally, for example, the photovoltaic module may include a transparent front substrate, a backsheet and a photovoltaic or photovoltaic array encapsulated between the front substrate and the backsheet using an encapsulant. The photovoltaic array refers to an array of solar cells that are arranged in series or parallel, and the spaces of the cells may be filled with the encapsulant.

The above-mentioned multi-layered film according to the present invention may be used as the backsheet, and the thickness of the backsheet is not particularly limited, but may be, for example, 30 μm to 2,000 μm, 50 μm to 1,000 μm, or 100 μm to 600 μm. A thinner photovoltaic module may be formed, and the physical properties, such as weather resistance, of the photovoltaic module may be excellently maintained by controlling the thickness of the backsheet within the range of 30 μm to 2,000 μm according to the present invention.

A specific type of the solar cell may not be particularly limited as long as it may cause a photoelectromotive force, and a photovoltaic device that may be widely used in the art may be generally used. For the present invention, a crystalline silicon solar cell, such as monocrystalline silicon or polycrystalline silicon, an amorphous silicon solar cell, such as a single binding type or a tandem structure type, a group III-V compound semiconductor solar cell, such as gallium-arsenic (GaAs) or indium-phosphide (InP), a group II-VI compound semiconductor solar cell, such as cadmium-tellurium (CdTe) or copper-indium-selenide ($CuInSe_2$) may be used herein, and a thin-film polycrystalline silicon solar cell, a thin-film microcrystalline silicon solar cell, or a hybrid solar cell of thin-film crystalline silicon and amorphous silicon may also be used herein.

The solar cell may form a solar cell array (solar cell assembly) by wiring to connect between the solar cells. A light from the sun shines on the photovoltaic module of the present invention to generate electrons (−) and holes (+) in the solar cell so that a current can flow through the wiring that connects the solar cells.

A receiver sheet that may be used in the illustrative embodiments of the present invention may serve to protect the inside of the photovoltaic module from wind, rain, external shock or fire and secure long-time reliability when the photovoltaic module is exposed to the outdoors. A specific type of the receiver sheet is not particularly limited as long as it has excellent light transmission, electric insulation, mechanical, physical or chemical strength, and for example, a glass plate, a fluorine-based resin sheet, a cyclic polyolefin-based resin sheet, a polycarbonate-based resin sheet, a poly(meth) acrylic-based resin sheet, a polyamide-based resin sheet or a polyester-based resin sheet may be used. For the present invention, a glass plate with excellent heat resistance may be used, but the present invention is not limited thereto.

The thickness of the receiver sheet is not particularly limited, but may be, for example, 0.5 mm to 10 mm, 1 mm to 8 mm, or 2 mm to 5 mm. A thinner photovoltaic module may be formed, and the physical properties, such as long-time reliability, of the photovoltaic module may be excellently maintained by controlling the thickness of the receiver sheet within the range of 0.5 mm to 10 mm.

According to the present invention, encapsulants generally known in the art may be used without limitation as long as they are applied to an encapsulant layer for encapsulating the solar cell or solar cell array inside the photovoltaic module, and more particularly, between the backsheet and the receiver sheet.

The multi-layered film of the present invention may be applied to various photovoltaic modules known in the art, including the above-mentioned kinds of the photovoltaic module. In this case, the method of constituting a photovoltaic module and other types of materials are not particularly limited.

Hereinafter, the illustrative embodiments of the present invention will be described in further detail with reference to Examples. However, the following Examples are described only for illustrative purposes, without departing from the scope of the present invention.

Physical properties of each of the films prepared in Examples and Comparative Examples were measured using the following methods.

1. 180° Peel Strength

Peel strength was measured by cutting a specimen into pieces having a width of 10 mm and peeling the specimen pieces at a peel strength of 180° and at a rate of 4.2 mm/sec, based on ASTM D1897.

2. Cross-Hatch Adhesive Strength

A cross cut test was performed based on the cross cut test standard, ASTM D3002/D3359. Specifically, 11 lines were drawn on a specimen with a knife widthwise and lengthwise at an interval of 1 mm to form 100 square lattices with lengths and breadths of 1 mm, respectively. Then, the peeling level of the cut surface was measured by attaching CT-24 adhesive tape, commercially available from Nichiban, to the cut surface of the specimen and peeling it off. Then, the specimen was evaluated based on the following standards.

<Cross-Hatch Adhesive Strength Standard>

5B: There is no peeled surface.
4B: The peeled surface is within 5% based on the total area.
3B: The peeled surface is between 5 and 15% based on the total area.
2B: The peeled surface is between 15 and 35% based on the total area.
1B: The peeled surface is between 35 and 65% based on the total area.
0B: The surface is almost entirely peeled off.

3. Damp Heat Test

The multi-layered films (on which the resin composition including the fluorine-based polymer/acrylic polymer including the thermosetting functional group/heat-curing agent was coated on both surfaces of the substrate and then cured) prepared in Examples and Comparative Examples were placed in an oven in which conditions of 85° C. and 85% R.H. were maintained, and then kept for 1,000 hours, 2,000 hours, or 3,000 hours. Thereafter, the changes in adhesive strength were measured. The unit "R.H." used throughout the specification refers to relative humidity.

4. Pressure Cooker Test (PCT)

The multi-layered films (on which the resin composition including the fluorine-based polymer/acrylic polymer including the thermosetting functional group/heat-curing agent was coated on both surfaces of the substrate and then cured) prepared in Examples and Comparative Examples were placed in an oven in which conditions of 2 atmospheric pressure (atm.), 121° C. and 100% R.H. were maintained, and then kept for 25 hours, 50 hours, 75 hours or 100 hours. Thereafter, the changes in adhesive strength were measured.

Preparation Example 1

Preparation of Substrate Layer

The surface of a PET film (commercially available from Kolon) with a thickness of 250 µm, both sides of which were treated with acrylic primer, was subjected to corona treatment.

Preparation of Fluorine-Based Polymer

In order to prepare the mixture of fluorine-based polymer and acrylic polymer including the thermosetting functional group, various fluorine-based polymers were prepared, as listed in the following Table 1. Table 1 lists the molecular weights and the melting points of the fluorine-based polymers used for Examples and Comparative Examples.

TABLE 1

| Polymer | Monomer ratio (Weight ratio) | Weight average molecular weight ($M_w$) | Melting point (° C.) |
|---|---|---|---|
| 1 VDF-HFP Copolymer | 90:10 (VDF:HFP) | 330,000 | 158 |
| 2 VDF-HFP Copolymer | 88:12 (VDF:HFP) | 590,000 | 135 |
| 3 VDF-HFP Copolymer | 85:15 (VDF:HFP) | 300,000 | 132 |
| 4 VDF-CTFE Copolymer | 80:20 (VDF:CTFE) | 280,000 | 166 |
| 5 VDF-CTFE Copolymer | 85:15 (VDF:CTFE) | 270,000 | 166 |
| 6 Branched PVDF | 100 (VDF) | 550,000 | 160 |
| 7 PVDF | 100 (VDF) | 320,000 | 169 |

VDF: Vinylidene fluoride
CTFE: Chlorotrifluoroethylene
HFP: Hexafluoropropylene
PVDF: Polyvinylidene fluoride homopolymer Example 1

Preparation of Resin Composition for Coating layer

The first coating solution was prepared by dissolving, in advance, 120 g of Polymer 5 [copolymer including a polymerized type of VDF and CTFE in a weight ratio of 85:15 (VDF:CTFE)] prepared in Preparation Example 1, 60 g of Polymer 2 [copolymer including a polymerized type of VDF and hexafluoropropylene (HEP) in a weight ratio of 88:12 (VDF:CTFE)] prepared in Preparation Example 1, 20 g of acrylic polymer (epoxy equivalent weight of 400 g) including the epoxy group, in which a weight ratio of methyl methacrylate (MMA):glycidylmethacrylate (GMA):butylmethacrylate (BMA):styrene (ST) was 49.5:35.5:10:5, and 5.75 g of 1,12-dodecanedioic acid (carboxy equivalent weight of 115 g) that was diacarboxylic acid as an epoxy curing agent in 600 g of N,N-dimethyl formamide (DMF) and 200 g of MEK.

In addition, a mill base was prepared by dissolving 140 g of titanium dioxide (TiPure TS6200, commercially available from DuPont) and 4.8 g of BYK W9010 (commercially available from BYK) as a pigment dispersing agent in 100 g of dimethylformamide, adding 100 g of zirconia beads with a diameter of 0.3 mm, stirring the resulting mixture at a rate of 1,000 rpm for 1 hour, and completely removing the beads, separately from the above-mentioned preparation of the first coating solution. The prepared mill base was added to the first coating solution prepared in advance, and then stirred to prepare a resin composition for a coating layer. In the above process, the mill base was prepared at 1.5 times the amount actually added to the coating layer in light of the amount of the mill base lost when removing the beads.

Coating, Drying and Curing

The resin composition for the coating layer was applied to the substrate prepared in advance using a comma reverse method. Especially, it was coated by controlling the space so that the thickness of the coating layer could be in the range of about 20 to 30 μm after drying, and the coating layer was then formed by successively passing the coated substrates with a length of 2 m through three ovens that were controlled to be at the temperatures of 80° C., 170° C., and 170° C., respectively, and at the rate of 0.5 m/min. Then, the same coating was performed on the opposite surface of the films having coating layers to prepare the multi-layered film coated with the cured product of the composition including a fluorine-based polymer, an acrylic polymer including an epoxy group, and a heat-curing agent on both surfaces of the PET film.

Example 2

A multi-layered film was prepared by the same method as in Example 1, except that titanium dioxide was not used.

Example 3

A multi-layered film was prepared by the same method as in Example 1, except that the type and the mixing ratio of the fluorine-based polymer included when preparing the resin composition for the coating layer were changed as listed in the following Table 2, and the content of titanium dioxide was changed to 280 g.

Examples 4 to 8

A multi-layered film was prepared by the same method as in Example 1, except that the type and the mixing ratio of the fluorine-based polymer included when preparing the resin composition for the coating layer were changed as listed in the following Table 2.

Comparative Example 1

Icosolar 2442, which is a commercial product from Isovolta, was used as the multi-layered film. Icosolar 2442 product was prepared by laminating the PVF film (thickness: 38 μm) that was prepared by the extruding process on both sides of the PET film using an adhesive.

Comparative Example 2

Icosolar 3469, which is a commercial product from Isovolta, was used as the multi-layered film. Icosolar 3469 product was prepared by laminating the PVF film (thickness: 25 μm) that was prepared by the casting process on both sides of the PET film using an adhesive.

TABLE 2

| | Resin composition components for coating layer | | | | Equivalent weight ratio (Carboxyl group/ epoxy group) |
|---|---|---|---|---|---|
| | Fluorine-based polymer | | Acrylic | Curing | |
| | Composition | Content (g) | polymer content (g) | agent content (g) | |
| Example 1 | Polymer 5 Polymer 2 | 120 60 | 20 | 5.75 | 1 |
| Example 2 | Polymer 5 Polymer 2 | 120 60 | 20 | 5.75 | 1 |
| Example 3 | Polymer 4 Polymer 2 | 100 80 | 20 | 5.75 | 1 |
| Example 4 | Polymer 4 Polymer 1 | 100 80 | 20 | 5.75 | 1 |
| Example 5 | Polymer 4 Polymer 2 | 120 60 | 20 | 5.75 | 1 |
| Example 6 | Polymer 5 Polymer 1 | 120 60 | 20 | 5.75 | 1 |
| Example 7 | Polymer 4 Polymer 6 | 100 80 | 20 | 5.75 | 1 |
| Example 8 | Polymer 4 Polymer 7 | 120 60 | 20 | 5.75 | 1 |
| Com. Ex. 1 | Icosolar 2442 | | 0 | 0 | — |
| Com. Ex. 2 | Icosolar 3469 | | 0 | 0 | — |

Experimental Example 1

180° peel strength and cross-hatch tests were performed after performing the PCT on the multi-layered films of Examples 1 to 8 and Comparative Examples 1 and 2. Specifically, each multi-layered film was placed under the conditions of 2 atm., 121° C., and 100% R.H. for 50 hours, 75 hours, and 100 hours, and 180° peel strength and cross-hatch tests were then performed to estimate the changes in the adhesive strength. The estimated results are shown in the following Table 3.

TABLE 3

| | 180° peel strength (N/cm) | | | | Cross-hatch test results | | | |
|---|---|---|---|---|---|---|---|---|
| | Initial | 50 hrs | 75 hrs | 100 hrs | Initial | 50 hrs | 75 hrs | 100 hrs |
| Example 1 | Coat-T | Coat-T | Coat-T | PET-T | 5B | 5B | 5B | PET-T |
| Example 2 | Coat-T | Coat-T | Coat-T | PET-T | 5B | 5B | 5B | PET-T |
| Example 3 | Coat-T | Coat-T | Coat-T | PET-T | 5B | 5B | 5B | PET-T |
| Example 4 | Coat-T | Coat-T | Coat-T | PET-T | 5B | 5B | 5B | PET-T |
| Example 5 | Coat-T | Coat-T | Coat-T | PET-T | 5B | 5B | 5B | PET-T |

TABLE 3-continued

|  | 180° peel strength (N/cm) | | | | Cross-hatch test results | | | |
|---|---|---|---|---|---|---|---|---|
|  | Initial | 50 hrs | 75 hrs | 100 hrs | Initial | 50 hrs | 75 hrs | 100 hrs |
| Example 6 | Coat-T | Coat-T | Coat-T | PET-T | 5B | 5B | 5B | PET-T |
| Example 7 | Coat-T | Coat-T | Coat-T | PET-T | 5B | 5B | 5B | PET-T |
| Example 8 | Coat-T | Coat-T | Coat-T | PET-T | 5B | 5B | 5B | PET-T |
| Com. Ex. 1 | PVF-T | PVF-T | 0 | 0 | 5B | 5B | 1B | 0B |
| Com. Ex. 2 | 7 | PVF-T | 0 | 0 | 5B | 1B | 1B | 0B |

Coat-T: Peel strength could not be precisely measured because coating layer was torn while peeling.
PET-T: Peel strength could not be precisely measured because PET film was torn while peeling.
PVF-T: Peel strength could not be precisely measured because PVF film was torn while peeling.

As shown in Table 3, for the multi-layered film according to one illustrative embodiment of the present invention, the coating layer including the cured product of the mixture of the fluorine-based polymer, the acrylic polymer including an epoxy group as the thermosetting functional group, and the heat-curing agent which exhibited high initial adhesive strength with the substrate (PET), and also had an excellent adhesive strength after performing the PCT for 100 hours. In addition, after performing the PCT for 100 hours, there was no change in appearance, such as interface delamination, pinhole formation, and the like on the coating layer. Meanwhile, it was found that for the commercially available multi-layered films, Icosolar 2442 and 3469, the adhesive strength with the substrate was greatly decreased while performing the PCT.

Experimental Example 2

180° peel strength and cross-hatch tests were performed after performing a damp heat test on the multi-layered films of Examples 1 to 8 and Comparative Examples 1 and 2. Specifically, each multi-layered film was placed in an oven in which conditions of 85° C. and 85% R.H. were maintained, and then kept for 1,000 hours, 2,000 hours, and 3,000 hours. Thereafter, 180° peel strength and cross-hatch tests were performed to estimate the changes in the peel strength. The estimated results are shown in the following Table 4.

TABLE 4

|  | 180° peel strength (N/cm) | | | | Cross-hatch test results | | | |
|---|---|---|---|---|---|---|---|---|
|  | Initial | 1000 hrs | 2000 hrs | 3000 hrs | Initial | 1000 hrs | 2000 hrs | 3000 hrs |
| Example 1 | Coat-T | Coat-T | Coat-T | PET-T | 5B | 5B | 5B | 5B |
| Example 2 | Coat-T | Coat-T | Coat-T | PET-T | 5B | 5B | 5B | 5B |
| Example 3 | Coat-T | Coat-T | Coat-T | PET-T | 5B | 5B | 5B | 5B |
| Example 4 | Coat-T | Coat-T | Coat-T | PET-T | 5B | 5B | 5B | 5B |
| Example 5 | Coat-T | Coat-T | Coat-T | PET-T | 5B | 5B | 5B | 5B |
| Example 6 | Coat-T | Coat-T | Coat-T | PET-T | 5B | 5B | 5B | PET-T |
| Example 7 | Coat-T | Coat-T | Coat-T | PET-T | 5B | 5B | 5B | 5B |
| Example 8 | Coat-T | Coat-T | Coat-T | PET-T | 5B | 5B | 5B | 5B |
| Com. Ex. 1 | PVF-T | PVF-T | PVF-T | 0 | 5B | 5B | 5B | 0B |
| Com. Ex. 2 | 7 | 2 | 0.7 | Wrinkle Generation | 5B | 5B | 4B | 0B |

Coat-T: Peel strength could not be precisely measured because coating layer was torn while peeling.
PET-T: Peel strength could not be precisely measured because PET film was torn while peeling.
PVF-T: Peel strength could not be precisely measured because PVF film was torn while peeling.

As shown in Table 4, for the multi-layered film according to one illustrative embodiment of the present invention, the coating layer including the cured product of the mixture of the fluorine-based polymer, the acrylic polymer including an epoxy group as the thermosetting functional group, and the heat-curing agent which exhibited high initial adhesive strength with the substrate (PET), and also had an excellent adhesive strength after performing the damp heat test for 3,000 hours. In addition, after performing the damp heat test for 3,000 hours, there was no change in appearance, such as interface delamination, pinhole formation, and the like on the coating layer. Meanwhile, it was found that the commercially available multi-layered film Icosolar 2442 adhered with the extruded film, and 3469 adhered with the casting film. The adhesive strength with the substrate was greatly decreased while performing the damp heat test.

Examples 9 to 14

A multi-layered film was prepared with the same method as Example 1, except that PVDF (Polymer 7), which was a single copolymer of VDF, was used as the fluorine-based polymer in the process of preparing the resin composition for the coating layer, a relative amount of the fluorine-based polymer, the thermosetting acrylic polymer and the epoxy curing agent was controlled, and the content of titanium dioxide included in the mill base was changed to 70 g, as shown in the following Table 5.

Comparative Examples 3 to 8

Multi-layered films were prepared by the same methods as in Examples 10 to 15, respectively, except that PMMA, which is a non-thermosetting acrylic polymer, was used as the acrylic polymer, and an epoxy curing agent was not used in the process of preparing the resin composition for the coating layer.

TABLE 5

| | Fluorine-based polymer | Acrylic polymer | | | Equivalent weight |
| --- | --- | --- | --- | --- | --- |
| | Polymer 7 content (g) | Type | Content (g) | Epoxy curing agent content (g) | ratio (Carboxyl group/epoxy group) |
| Example 9 | 95 | Same type as in Example 1 | 5 | 2.88 | 2 |
| Example 10 | 90 | Same type as in Example 1 | 10 | 2.88 | 1 |
| Example 11 | 80 | Same type as in Example 1 | 20 | 2.88 | 0.5 |
| Example 12 | 70 | Same type as in Example 1 | 30 | 2.88 | 0.33 |
| Example 13 | 60 | Same type as in Example 1 | 40 | 2.88 | 0.25 |
| Example 14 | 50 | Same type as in Example 1 | 50 | 2.88 | 0.2 |
| Com. Ex. 3 | 95 | PMMA | 5 | 0 | — |
| Com. Ex. 4 | 90 | PMMA | 10 | 0 | — |
| Com. Ex. 5 | 80 | PMMA | 20 | 0 | — |
| Com. Ex. 6 | 70 | PMMA | 30 | 0 | — |
| Com. Ex. 7 | 60 | PMMA | 40 | 0 | — |
| Com. Ex. 8 | 50 | PMMA | 50 | 0 | — |

Experimental Example 3

180° peel strength and cross-hatch tests were performed after performing the PCT on the multi-layered films of Examples 8 to 14 and Comparative Examples 3 to 8. Specifically, each multi-layered film was placed under the conditions of 2 atm., 121° C., and 100% R.H. for 25 hours, 50 hours, and 75 hours, and 180° peel strength and cross-hatch tests were then performed to estimate the changes in the adhesive strength. The estimated results are shown in the following Table 6.

TABLE 6

| | 180° peel strength (N/cm) | | | | Cross-hatch test results | | | |
| --- | --- | --- | --- | --- | --- | --- | --- | --- |
| | Initial | 25 hrs | 50 hrs | 75 hrs | Initial | 25 hrs | 50 hrs | 75 hrs |
| Example 9 | Coat-T | Coat-T | Coat-T | Coat-T | 5B | 5B | 5B | 5B |
| Example 10 | Coat-T | Coat-T | Coat-T | Coat-T | 5B | 5B | 5B | 5B |
| Example 11 | Coat-T | Coat-T | Coat-T | Coat-T | 5B | 5B | 5B | 5B |
| Example 12 | Coat-T | Coat-T | Coat-T | Coat-T | 5B | 5B | 5B | 5B |
| Example 13 | Coat-T | Coat-T | Coat-T | Coat-T | 5B | 5B | 5B | 5B |
| Example 14 | Coat-T | Coat-T | Coat-T | Coat-T | 5B | 5B | 5B | 5B |
| Com. Ex. 3 | Coat-T | Interface peel | — | — | 5B | 0B | — | — |
| Com. Ex. 4 | Coat-T | Interface peel | | — | 5B | 0B | — | — |
| Com. Ex. 5 | Coat-T | Interface peel | — | — | 5B | 0B | — | — |
| Com. Ex. 6 | Coat-T | Interface peel | — | — | 5B | 0B | — | — |
| Com. Ex. 7 | Coat-T | Interface peel | — | — | 5B | 0B | — | — |
| Com. Ex. 8 | Coat-T | Interface peel | — | — | 5B | 0B | — | — |

Coat-T: Peel strength could not be precisely measured because the coating layer was torn while peeling.

As shown in Table 6, it was found that the adhesive reliability between the coating layer and the substrate under the conditions of high temperature and high humidity was excellent in Examples 9 to 14 that used the acrylic polymer including the thermosetting functional group and curing agent, compared to Comparative Examples 3 to 8 that used the thermosetting functional group-free acrylic polymer, PMMA. In addition, it was found that in the case of the multi-layered films according to one illustrative embodiment of the present invention, the coating layer including the cured product of the mixture of the fluorine-based polymer, the acrylic polymer including the epoxy group as the thermosetting functional group, and the heat-curing agent maintained a proper level of cross-linking degree by controlling the equivalent weight of the carboxy group of the curing agent and the epoxy group of the acrylic polymer within the above-mentioned range so that the physical properties of the film were excellent, and also the adhesive strength was improved by reacting a part of the coating layer with the surface of the film.

Examples 15 to 20, and Comparative Example 9

A multi-layered film was prepared by the same method as in Example 9, except that Polymer 6, which is a single copolymer of branched VDF, was used as the fluorine-based polymer, and a relative amount of the fluorine-based polymer, the thermosetting acrylic polymer, and the epoxy curing agent was changed as shown in the following Table 7 in the process of preparing the resin composition for the coating layer.

TABLE 7

Resin composition components for coating layer

| | Fluorine-based polymer Polymer 6 content (g) | Acrylic polymer Type | Acrylic polymer Content (g) | Epoxy curing agent content (g) | Equivalent weight ratio (Carboxyl group/ epoxy group) |
|---|---|---|---|---|---|
| Example 15 | 95 | Same type as in Example 1 | 5 | 1.44 | 1 |
| Example 16 | 90 | Same type as in Example 1 | 10 | 2.88 | 1 |
| Example 17 | 80 | Same type as in Example 1 | 20 | 5.75 | 1 |
| Example 18 | 70 | Same type as in Example 1 | 30 | 8.63 | 1 |
| Example 19 | 60 | Same type as in Example 1 | 40 | 11.5 | 1 |
| Example 20 | 50 | Same type as in Example 1 | 50 | 14.4 | 1 |
| Comparative Example 9 | 100 | — | — | — | — |

Experimental Example 4

180° peel strength and cross-hatch tests were performed after performing the PCT on the multi-layered films of Examples 15 to 20 and Comparative Example 9. Specifically, each multi-layered film was placed under the conditions of 2 atm., 121° C., and 100% R.H. for 25 hours, 50 hours, and 75 hours, and 180° peel strength and cross-hatch tests were then performed to estimate the changes of the adhesive strength. The estimated results are shown in the following Table 8.

TABLE 8

| | 180° peel strength (N/cm) | | | | Cross-hatch test results | | | |
|---|---|---|---|---|---|---|---|---|
| | Initial | 25 hrs | 50 hrs | 75 hrs | Initial | 25 hrs | 50 hrs | 75 hrs |
| Example 15 | Coat-T | Coat-T | Coat-T | Coat-T | 5B | 5B | 5B | 5B |
| Example 16 | Coat-T | Coat-T | Coat-T | Coat-T | 5B | 5B | 5B | 5B |
| Example 17 | Coat-T | Coat-T | Coat-T | Coat-T | 5B | 5B | 5B | 5B |
| Example 18 | Coat-T | Coat-T | Coat-T | Coat-T | 5B | 5B | 5B | 5B |
| Example 19 | Coat-T | Coat-T | Coat-T | Coat-T | 5B | 5B | 5B | 5B |
| Example 20 | Coat-T | Coat-T | Coat-T | Coat-T | 5B | 5B | 5B | 5B |
| Comparative Example 9 | Coat-T | Coat-T | — | — | 5B | 0B | — | — |

Coat-T: Peel strength could not be precisely measured because the coating layer was torn while peeling As shown in Table 8, it was found that for Comparative Example 9 in which the coating layer was formed with only Polymer 6, the adhesive strength was very low, but for Examples 15 to 20 in which the acrylic polymer included with the thermosetting functional group and the curing agent was used, the adhesive strength was excellent under the conditions of high temperature and high humidity.

Examples 21 to 27

Multi-layered films were prepared by the same method as in Example 1, except that 4.7 g of azelaic acid ($HOOC(CH_2)_7COOH$, carboxyl group equivalent weight of 94 g), 5.4 g of undecanedioic acid ($HOOC(CH_2)_9COOH$, carboxyl group equivalent weight of 108 g), 7.2 g of hexadecanedioic acid ($HOOC(CH_2)_{14}COOH$, carboxyl group equivalent weight of 143 g), 1.2 g of triethylenetetramine ($NH_2CH_2CH_2$ ($NHCH_2CH_2)_2NH_2$, amine group equivalent weight of 24 g), 3.85 g of hexahydro phthalic anhydride ($C_8H_{10}O_3$, carboxyl group equivalent weight of 77 g), 5.5 g of 2-ethyl-4-methyl imidazole (imidazole group equivalent weight of 110 g), and 6.1 g of $BF_3$-mono thylene amine ($C_2H_7BF_3N$, amine group equivalent weight of 112 g) were used respectively as the epoxy curing agent instead of 5.75 g of 1,12-dodecanedioic acid, which is a dicarboxylic acid, in the process of preparing the resin composition for the coating layer.

Examples 28 to 30

Multi-layered films were prepared by the same method as in Example 1, except that 20 g of the acrylic polymer (epoxy equivalent weight of 600 g) with the weight ratio of 56.3:23.7:13.3:6.7 of MMA:GMA:BMA:ST was used as the thermosetting acrylic polymer instead of 20 g of the acrylic polymer (epoxy equivalent weight of 400 g) with the weight ratio of 49.5:35.5:10:5 of MMA:GMA:BMA:ST, and 3.1 g of azelaic acid ($HOOC(CH_2)_7COOH$, carboxyl group equivalent weight of 94 g), 3.6 g of undecanedioic acid ($HOOC(CH_2)_9COOH$, carboxyl group equivalent weight of 108 g), and 4.8 g of hexadecanedioic acid ($HOOC(CH_2)_{14}COOH$, carboxyl group equivalent weight of 143 g) were used respectively as the epoxy curing agent instead of 5.75 g of 1,12-dodecanedioic acid, which is a dicarboxylic acid, in the process of preparing the resin composition for the coating layer.

TABLE 9

| | Resin composition components for coating layer | | | | | Equivalent weight ratio (Carboxyl group/epoxy group) |
|---|---|---|---|---|---|---|
| | Fluorine-based polymer Content (g) | Acrylic polymer | | Curing agent | | |
| | | Type | Content (g) | Type | Content (g) | |
| Example 21 | 180 | Same type as in Example 1 | 20 | Azelaic acid | 4.7 | 1 |
| Example 22 | 180 | Same type as in Example 1 | 20 | Undecanedioic acid | 5.4 | 1 |
| Example 23 | 180 | Same type as in Example 1 | 20 | Hexadecanedioic acid | 7.2 | 1 |
| Example 24 | 180 | Same type as in Example 1 | 20 | Triethylene tetramine | 1.2 | 1 |
| Example 25 | 180 | Same type as in Example 1 | 20 | Hexahydro phthalic anhydride | 3.85 | 1 |
| Example 26 | 180 | Same type as in Example 1 | 20 | 2-ethyl-4-methylimidazole | 5.5 | 1 |
| Example 27 | 180 | Same type as in Example 1 | 20 | $BF_3$-monoethyleneamine | 6.1 | 1 |
| Example 28 | 180 | MMA:GMA:BMA:ST = 56.3:23.7:13.3:6.7 | 20 | Azelaic acid | 3.1 | 1 |
| Example 29 | 180 | Same | 20 | Undecanedioic acid | 3.6 | 1 |
| Example 30 | 180 | Same | 20 | Hexadecanedioic acid | 4.8 | 1 |

Experimental Example 5

180° peel strength and cross-hatch tests were performed after performing the PCT on the multi-layered films of Examples 21 to 30. Specifically, each multi-layered film was placed under the conditions of 2 atm., 121° C., and 100% R.H. for 25 hours, 50 hours, and 75 hours, and then 180° peel strength and cross-hatch tests were performed to estimate the changes in the adhesive strength. The estimated results are shown in the following Table 10.

TABLE 10

| | 180° peel strength (N/cm) | | | | Cross-hatch test results | | | |
|---|---|---|---|---|---|---|---|---|
| | Initial | 25 hrs | 50 hrs | 75 hrs | Initial | 25 hrs | 50 hrs | 75 hrs |
| Example 21 | Coat-T | Coat-T | Coat-T | Coat-T | 5B | 5B | 5B | 5B |
| Example 22 | Coat-T | Coat-T | Coat-T | Coat-T | 5B | 5B | 5B | 5B |
| Example 23 | Coat-T | Coat-T | Coat-T | Coat-T | 5B | 5B | 5B | 5B |
| Example 24 | Coat-T | Coat-T | Coat-T | Coat-T | 5B | 5B | 5B | 5B |
| Example 25 | Coat-T | Coat-T | Coat-T | Coat-T | 5B | 5B | 5B | 5B |
| Example 26 | Coat-T | Coat-T | Coat-T | Coat-T | 5B | 5B | 5B | 5B |
| Example 27 | Coat-T | Coat-T | Coat-T | Coat-T | 5B | 5B | 5B | 5B |
| Example 28 | Coat-T | Coat-T | Coat-T | Coat-T | 5B | 5B | 5B | 5B |
| Example 29 | Coat-T | Coat-T | Coat-T | Coat-T | 5B | 5B | 5B | 5B |
| Example 30 | Coat-T | Coat-T | Coat-T | Coat-T | 5B | 5B | 5B | 5B |

Coat-T: Peel strength could not be precisely measured because the coating layer was torn while peeling As shown in Table 10, it was found that the adhesive strength was excellent under the conditions of high temperature and high humidity for Examples 21 to 30 in which the acrylic polymer including the thermosetting functional group and the curing agent was used.

Example 31

A multi-layered film was prepared by the same method as in Example 1, except that 20 g of the acrylic polymer (functional group equivalent weight of 198 g) with the weight ratio of 100:98 of MMA:maleic anhydride (MA) was used instead of 20 g of the acrylic polymer (epoxy equivalent weight of 400 g) with the weight ratio of 49.5:35.5:10:5 of MMA: GMA: BMA: ST as the thermosetting acrylic polymer, and 2.4 g of triethylenetetramine ($NH_2CH_2CH_2(NHCH_2CH_2)_2NH_2$, amine group equivalent weight of 24 g) was used instead of 5.75 g of 1,12-dodecanedioic acid as the curing agent in the process of preparing the resin composition for the coating layer.

Example 32

A multi-layered film was prepared by the same method as in Example 1, except that 20 g of the acrylic polymer (functional group equivalent weight of 116 g) with the weight ratio of 100:248 of MMA:methacryloxypropyltrimethoxy silane (MPTS) was used instead of 20 g of the acrylic polymer (epoxy equivalent weight of 400 g) with the weight ratio of 49.5:35.5:10:5 of MMA:GMA:BMA:ST as the thermosetting acrylic polymer, and 1.5 g of water (OH equivalent weight of 9 g) was used instead of 5.75 g of 1,12-dodecanedioic acid as the curing agent in the process of preparing the resin composition for the coating layer.

Example 33

A multi-layered film was prepared by the same method as in Example 1, except that 20 g of the acrylic polymer (functional group equivalent weight of 197 g) with the weight ratio of 100:97 of MMA:vinyl oxazoline (VO) was used instead of 20 g of the acrylic polymer (epoxy equivalent weight of 400 g) with the weight ratio of 49.5:35.5:10:5 of MMA:GMA:BMA:ST as the thermosetting acrylic polymer, and 11.5 g of 1,12-dodecanedioic acid was used as the curing agent in the process of preparing the resin composition for the coating layer.

Example 34

A multi-layered film was prepared by the same method as in Example 1, except that 20 g of the acrylic polymer (functional group equivalent weight of 172 g) with the weight ratio of 100:72 of MMA:acrylic acid (AA) was used instead of 20 g of the acrylic polymer (epoxy equivalent weight of 400 g) with the weight ratio of 49.5:35.5:10:5 of MMA:GMA:BMA:ST as the thermosetting acrylic polymer, and 22.9 g of the acrylic polymer (functional group equivalent weight of 197 g) with the weight ratio of 100:97 of MMA:VO was used instead of 5.75 g of 1,12-dodecanedioic acid as the curing agent in the process of preparing the resin composition for the coating layer.

TABLE 11

| | Resin composition components for coating layer | | | | | Equivalent weight ratio (Functional group/Curing agent) |
|---|---|---|---|---|---|---|
| | Fluorine-based polymer Content (g) | Acrylic polymer | | Curing agent | | |
| | | Type | Content (g) | Type | Content (g) | |
| Example 31 | 180 | MMA:MA = 100:98 | 20 | Triethylene tetramine | 2.4 | 1 |
| Example 32 | 180 | MMA:MPS = 100:248 | 20 | Water | 1.5 | 1 |
| Example 33 | 180 | MMA:VO = 100:97 | 20 | Dodecanedioic acid | 11.5 | 1 |
| Example 34 | 180 | MMA:AA = 100:72 | 20 | MMA:VO = 100:97 | 22.9 | 1 |

Experiment Example 6

180° peel strength and cross-hatch tests were performed after performing the PCT on the multi-layered films of Examples 31 to 34. Specifically, each multi-layered film was placed under the conditions of 2 atm., 121° C., and 100% R.H. for 25 hours, 50 hours, and 75 hours, and then 180° peel strength and cross-hatch tests were performed to estimate the changes in the adhesive strength. The estimated results are shown in the following Table 12.

TABLE 12

| | 180° peel strength (N/cm) | | | | Cross-hatch test results | | | |
|---|---|---|---|---|---|---|---|---|
| | Initial | 25 hrs | 50 hrs | 75 hrs | Initial | 25 hrs | 50 hrs | 75 hrs |
| Example 31 | Coat-T | Coat-T | Coat-T | Coat-T | 5B | 5B | 5B | 5B |
| Example 32 | Coat-T | Coat-T | Coat-T | Coat-T | 5B | 5B | 5B | 5B |
| Example 33 | Coat-T | Coat-T | Coat-T | Coat-T | 5B | 5B | 5B | 5B |
| Example 34 | Coat-T | Coat-T | Coat-T | Coat-T | 5B | 5B | 5B | 5B |

Coat-T: Peel strength could not be precisely measured because the coating layer was torn while peeling.

As shown in Table 12, it was found that the adhesive strength was excellent under the conditions of high temperature and high humidity for Examples 31 to 34 that used the acrylic polymer including the thermosetting functional group and the curing agent.

The resin composition according to the illustrative embodiments of the present invention includes a fluorine-based polymer, an acrylic polymer including a thermosetting functional group, and a heat-curing agent, and a multi-layered film including a coating layer of a cured product formed by applying the resin composition on a substrate. Curing the resin composition has an excellent reliability and adhesive strength under heat-resistant and waterproof conditions and also is excellent for weather resistance and durability. In addition, the resin composition can be prepared at a low cost and low drying temperature using a low boiling point solvent, thereby reducing the manufacturing costs. Also, the multi-layered film may be useful as a backsheet for solar cells so that photovoltaic module can show excellent durability even when exposed to an external environment for a long period.

While the invention has been shown and described with reference to certain illustrative embodiments thereof, it will be understood by those skilled in the art that various changes in form and details may be made therein without departing from the scope of the invention as defined by the appended claims.

What is claimed is:

1. A resin composition, comprising:
   a fluorine-based polymer;
   an acrylic polymer including at least one of a thermosetting functional group selected from the group consisting of a carboxyl group, an amide group, an amino group, an epoxy group, an isocyanate group, a cyano group, an acid anhydride group, a mercapto group, a silanol group, an alkoxysilane group, and an oxazoline group; and
   a heat-curing agent,
   wherein the degree of crystallinity of the fluorine-based polymer is 55% or less, and
   wherein an equivalent weight of the thermosetting functional group of the acrylic polymer is at least 800 to less than 40,000 in the resin composition.

2. The resin composition of claim 1, wherein the fluorine-based polymer is a homopolymer, a copolymer or a mixture thereof, including at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluoro butylethylene, perfluoro (methylvinylether) (PMVE), perfluoro(ethylvinylether) (PEVE), perfluoro(propylvinylether) (PPVE), perfluoro (hexylvinylether) (PHVE), perfluoro-2,2-dimethyl-1,3-dioxol (PDD), and perfluoro-2-methylene-4-methyl-1,3-dioxolane (PMD) in a polymerized type.

3. The resin composition of claim 1, wherein the fluorine-based polymer is a copolymer or a mixture thereof, including vinylidene fluoride (VDF) or vinyl fluoride (VF), and at least one comonomer selected from the group consisting of tetrafluoroethylene (TFE), hexafluoropropylene (HFP), chlorotrifluoroethylene (CTFE), trifluoroethylene, hexafluoroisobutylene, perfluoro butylethylene, perfluoro (methylvinylether) (PMVE), perfluoro(ethylvinylether) (PEVE), perfluoro(propylvinylether) (PPVE), perfluoro (hexylvinylether) (PHVE), perfluoro-2,2-dimethyl-1,3-dioxol (PDD), and perfluoro-2-methylene-4-methyl-1,3-dioxolane (PMD).

4. The resin composition of claim 3, wherein the content of the comonomer included in the fluorine-based polymer is 0.5 to 50 wt % based on the total weight of the fluorine-based polymer.

5. The resin composition of claim 1, wherein a weight average molecular weight of the fluorine-based polymer is 50,000 to 1,000,000.

6. The resin composition of claim 1, wherein the melting point of the fluorine-based polymer is 80° C. to 175° C.

7. The resin composition of claim 1, wherein the acrylic polymer including the thermosetting functional group is a copolymer that further includes a polymerizable monomer.

8. The resin composition of claim 7, wherein the polymerizable monomer is styrene, chlorostyrene, chloromethylstyrene, methylstyrene, methacrylonitrile, acrylonitrile, cyclohexylmaleimide, or hydroxyethyl(meth)acrylate.

9. The resin composition of claim 1, wherein the content of the acrylic polymer including the thermosetting functional group is 50 wt % or less in the resin composition.

10. The resin composition of claim 1, wherein the heat-curing agent is at least one selected from the group consisting of an amine-based curing agent, an acid anhydride-based curing agent, an imidazole-based curing agent, a carboxylic acid-based curing agent, an organic acid hydrazide-based curing agent, a phenol-based curing agent, a polyol-based curing agent, and a melamine-based curing agent.

11. The resin composition of claim 10, wherein the heat-curing agent is a compound having 2 to 22 carbons with at least two carboxyl groups in a molecule.

12. The resin composition of claim 1, wherein the heat-curing agent is included to be 0.1 to 3 of an equivalent weight ratio of the functional group of the heat-curing agent and the thermosetting functional group of the acrylic polymer in the resin composition.

13. The resin composition of claim 11, wherein the equivalent weight ratio of the carboxyl group of the heat-curing agent and the thermosetting functional group of the acrylic polymer is 0.1 to 3.

14. The resin composition of claim 1, further comprising a solvent with a boiling point of 200° C. or lower.

15. A multi-layered film, comprising:
    a substrate; and
    a coating layer formed on the substrate and including a cured product of the resin composition according to claim 1.

16. A method of manufacturing a multi-layered film, comprising:
    applying the resin composition according to claim 1 onto a substrate; and
    curing the applied resin composition to form a coating layer.

17. A backsheet for photovoltaic modules including the multi-layered film according to claim 15.

18. A photovoltaic module including the backsheet for photovoltaic modules according to claim 17.

* * * * *